US012757554B2

(12) United States Patent
Lemieux et al.

(10) Patent No.: US 12,757,554 B2
(45) Date of Patent: Oct. 6, 2026

(54) LIGHT EMITTING DIODE DISPLAYS WITH LIGHT EMITTING DIODE PAIRS AND INTEGRATED CIRCUITS IN LIGHT EMITTING DIODE PACKAGES

(71) Applicant: CHRISTIE DIGITAL SYSTEMS USA, INC., Cypress, CA (US)

(72) Inventors: Marc Lemieux, Guelph (CA); Christopher Wolff, Kitchener (CA); Bryan Hemphill, Waterloo (CA)

(73) Assignee: CHRISTIE DIGITAL SYSTEMS USA, INC., Cypress, CA (US)

(*) Notice: Subject to any disclaimer, the term of this patent is extended or adjusted under 35 U.S.C. 154(b) by 349 days.

(21) Appl. No.: 18/627,568

(22) Filed: Apr. 5, 2024

(65) Prior Publication Data

US 2025/0318340 A1 Oct. 9, 2025

(51) Int. Cl.

| | |
|---|---|
| ***H10H 29/14*** | (2025.01) |
| ***H05B 45/20*** | (2020.01) |
| ***H10H 20/819*** | (2025.01) |
| ***H10H 20/857*** | (2025.01) |

(52) U.S. Cl.

CPC ........... *H10H 29/142* (2025.01); *H05B 45/20* (2020.01); *H10H 20/819* (2025.01); *H10H 20/857* (2025.01)

(58) Field of Classification Search

CPC .. H10H 29/142; H10H 20/819; H10H 20/857; H10H 29/34; H10H 29/49; H05B 45/20; G06F 3/147; G09G 3/003; G09G 3/2088; G09G 3/32; G09G 2300/0426

See application file for complete search history.

(56) References Cited

U.S. PATENT DOCUMENTS

| | | | |
|---|---|---|---|
| 6,769,772 | B2 | 8/2004 | Roddy et al. |
| 10,943,946 | B2 | 3/2021 | Rotzoll et al. |
| 11,024,609 | B2 | 6/2021 | Kong et al. |
| 11,376,518 | B2 | 7/2022 | Tremblay et al. |
| 11,438,991 | B2 | 9/2022 | Scarpa et al. |

(Continued)

FOREIGN PATENT DOCUMENTS

| | | | |
|---|---|---|---|
| CN | 112289781 | B | 2/2023 |
| EP | 2439940 | B1 | 10/2015 |

(Continued)

*Primary Examiner* — Tucker J Wright

(74) *Attorney, Agent, or Firm* — PERRY + CURRIER INC.

(57) ABSTRACT

A light emitting diode (LED) device is provided, comprising: a circuit board; a plurality of LED packages arranged on the circuit board, an LED package comprising: a pair of red LEDs arranged adjacent to one another, the pair of red LEDs configured to emit respective red light at respective different red wavelengths; a pair of green LEDs arranged adjacent to one another, the pair of green LEDs configured to emit respective green light at respective different green wavelengths; a pair of blue LEDs arranged adjacent to one another, the pair of blue LEDs configured to emit respective blue light at respective different blue wavelengths. The LED device further comprises an integrated circuit (IC) configured to independently control the pair of red LEDs, the pair of green LEDs and the pair of blue LEDs; and an electrical connector connected to respective integrated circuits of the plurality of LED packages.

10 Claims, 12 Drawing Sheets

Front Side

(56) References Cited

U.S. PATENT DOCUMENTS

| | | | |
|---|---|---|---|
| 11,664,008 B2 | 5/2023 | Iversen et al. | |
| 11,715,413 B2 | 8/2023 | Oh et al. | |
| 11,816,819 B2 | 11/2023 | Bogdanowicz et al. | |
| 11,837,151 B2 | 12/2023 | Park et al. | |
| 11,842,699 B2 | 12/2023 | Wyatt | |
| 2017/0352290 A1 | 12/2017 | Sasaki et al. | |
| 2020/0258867 A1 | 8/2020 | Harrold et al. | |
| 2020/0309357 A1 | 10/2020 | Hussell et al. | |
| 2021/0001242 A1* | 1/2021 | Tremblay | G09F 9/33 |
| 2021/0020614 A1 | 1/2021 | Yueh et al. | |
| 2021/0211618 A1 | 7/2021 | Silverstein et al. | |
| 2021/0227674 A1 | 7/2021 | Scarpa et al. | |
| 2022/0029121 A1 | 1/2022 | Yamazaki et al. | |
| 2022/0068900 A1 | 3/2022 | Niu et al. | |
| 2022/0069025 A1 | 3/2022 | Yamazaki et al. | |
| 2022/0223577 A1 | 7/2022 | Oh et al. | |
| 2023/0204198 A1 | 6/2023 | Pfeffer et al. | |
| 2023/0335690 A1 | 10/2023 | Herrmann et al. | |
| 2023/0386384 A1 | 11/2023 | Shafer et al. | |
| 2024/0069346 A1 | 2/2024 | Lam et al. | |

FOREIGN PATENT DOCUMENTS

| | | | |
|---|---|---|---|
| EP | 4116959 A1 | 1/2023 | |
| WO | WO-2016162837 A1 | 10/2016 | |
| WO | WO-2016162837 A4 | 10/2016 | |

* cited by examiner

Front Side

LIGHT EMITTING DIODE DISPLAYS WITH LIGHT EMITTING DIODE PAIRS AND INTEGRATED CIRCUITS IN LIGHT EMITTING DIODE PACKAGES

FIELD

The specification relates generally to light emitting diode displays, and specifically to light emitting diode displays with light emitting diode pairs and integrated circuits in light emitting diode packages.

BACKGROUND

Light emitting diode (LED) displays for cinema utilize passive drive LEDs, which can result in objectionable flicker, particularly at low brightness conditions. Furthermore it is challenging to achieve certain color spaces with LED displays. Additionally, projection cinema systems employ audio located behind a screen to achieve an immersive center channel. In contrast, LED displays for cinema face challenges in achieving comparable immersive audio and often resort to more complex audio steering or bouncing technology.

Similarly, in some instances, LED displays may be adapted for simulator environments, and in certain types of simulator environments night vision goggles (NVGs) may be used, for example to simulate use of NVGs in real world environments. Adapting LED displays for such simulator environments have specific challenges.

BRIEF DESCRIPTIONS OF THE DRAWINGS

For a better understanding of the various examples described herein and to show more clearly how they may be carried into effect, reference will now be made, by way of example only, to the accompanying drawings in which.

DETAILED DESCRIPTION

Figure 1A:
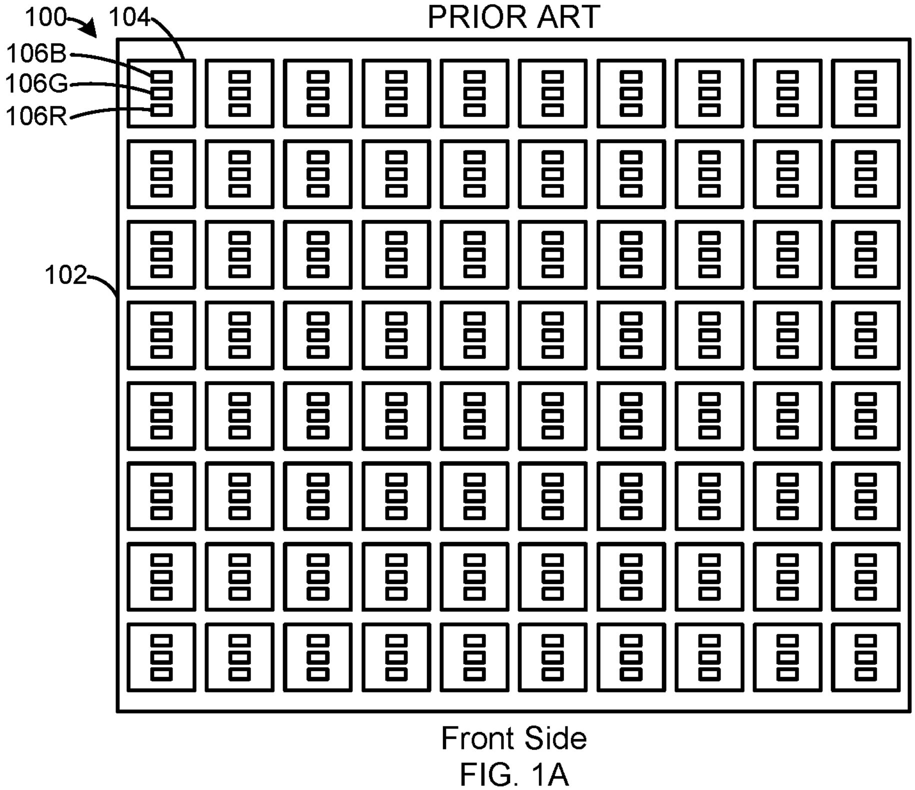
FIG. 1A depicts a front side schematic view of an example light emitting diode (LED) display, according to the prior art.

Light emitting diode (LED) displays for cinema face numerous challenges due use of passively driven LEDs, which may result in flicker, particularly at low brightness conditions, as well as achieving certain color spaces used in cinema, such as the ITU-R (International Telecommunication Union Radiocommunication) Recommendation BT (Broadcast Television).2020 color space (interchangeably referred to hereafter as REC 2020), and audio performance.

In some instances, LED displays may be adapted for simulator environments, and in certain types of simulator environments night vision goggles (NVGs) may be used, for example to simulate use of NVGs in real world environments.

Presently provided LED displays may provide flicker-free operation, REC2020 color space support, integrated circuits (IC) integrated with LED packages of the LED displays, and audio transparency.

Presently provided LED displays includes a plurality of LED packages, and a given LED package generally comprises two sets of red, green, and blue (RGB) LEDs configured to respectively emit light of different wavelengths (e.g., using any suitable wavelength shift mechanism) for a six primary color system, and that may provide REC2020 color space support. A given LED package further comprises an integrated circuit (IC) to drive the six LEDs of the given LED package; this integration may simplify printed circuit board assembly (PCBA) of a given LED package, but also allows for perforations to support audio transparency, enhancing the overall cinema experience.

In particular, an LED package as provided herein, includes two sets of RGB LEDs. Each pair of a given color of LED may be at a different wavelength such that an LED package may emit two red wavelengths, two green wavelengths and two blue wavelengths. As such, an LED package may emit six primary colors that may be used to expand a color space of the LED package, as compared to when an LED package includes one set of RGB LEDs. For example, LED packages as provided herein may provide REC2020 color space support.

Alternatively, or in addition, a plurality of such LED packages that include the six primary colors (e.g., two red, two green and two blue) may be integrated into an LED display that may be operated in a three-dimensional (3D)

mode, for example for use with 3D glasses that include notch filters in left and right lenses to receive different sets of wavelengths of RGB light, obviating use of low visual fidelity and/or low visual clarity polarized 3D glasses (and polarizers at the LED display), and/or expensive active shutter 3D glasses, providing a more comfortable and immersive viewing experience.

The integration of an LED driver IC into an LED package (e.g., one IC per LED package) may reduce reducing complexity of PCBAs and concomitant manufacturing costs. For example, as few as two printed circuit boards (PCBs) may be used to manufacture present LED packages.

Such a reduction in complexity of the LED package (e.g., relative to when external ICs are used to drive LEDs of a plurality of LED packages) may allow for perforations in a supporting circuit board that renders the circuit board transparent to audio, such that sound from a speaker mounted behind an LED display according to present examples passes through the LED display, thereby enhancing the synchronization of visual and auditory elements in a cinematic environment where the LED display is used. Such ICs integrated with LED packages may include a bypass input for redundancy in the event of an upstream pixel failure.

LED displays as provided herein may be used in digital cinema environments, entertainment venues that may require high-quality RGB LED displays and/or in any application and/or environment that may require advanced color reproduction, passive 3D visualization, and/or audio transparency.

The presently provided LED displays may further be adapted for simulator environments with or without ICs integrated into LED packages thereof.

An aspect of the present specification provides a device comprising: a circuit board; a plurality of light emitting diode (LED) packages arranged on the circuit board, an LED package comprising: a pair of red LEDs arranged adjacent to one another, the pair of red LEDs configured to emit respective red light at respective different red wavelengths; a pair of green LEDs arranged adjacent to one another, the pair of green LEDs configured to emit respective green light at respective different green wavelengths; a pair of blue LEDs arranged adjacent to one another, the pair of blue LEDs configured to emit respective blue light at respective different blue wavelengths; and an integrated circuit (IC) configured to independently control the pair of red LEDs, the pair of green LEDs and the pair of blue LEDs; and an electrical connector connected to respective integrated circuits of the plurality of LED packages, the electrical connector configured to communicate with an image providing device.

Another aspect of the present specification provides a light emitting diode (LED) package comprising: a pair of red LEDs arranged adjacent to one another, the pair of red LEDs configured to emit respective red light at respective different red wavelengths; a pair of green LEDs arranged adjacent to one another, the pair of green LEDs configured to emit respective green light at respective different green wavelengths; a pair of blue LEDs arranged adjacent to one another, the pair of blue LEDs configured to emit respective blue light at respective different blue wavelengths; and an integrated circuit (IC) configured to independently control the pair of red LEDs, the pair of green LEDs and the pair of blue LEDs.

Another aspect of the present specification provides a device comprising: a circuit board; a plurality of light emitting diode (LED) packages arranged on the circuit board, an LED package comprising: a plurality of groups of red, green and blue (RGB) LEDs; and an infrared LED, the plurality of groups of RGB LEDs and the infrared LED being in a least a two-to-one ratio; and an electrical connector connected to LEDs of the plurality of LED packages, the electrical connector configured to communicate with an image providing device.

Another aspect of the present specification provides a light emitting diode (LED) package comprising: a plurality of groups of red, green and blue (RGB) LEDs; and an infrared LED, the plurality of groups of RGB LEDs and the infrared LED being in a least a two-to-one ratio.

Figure 1B:
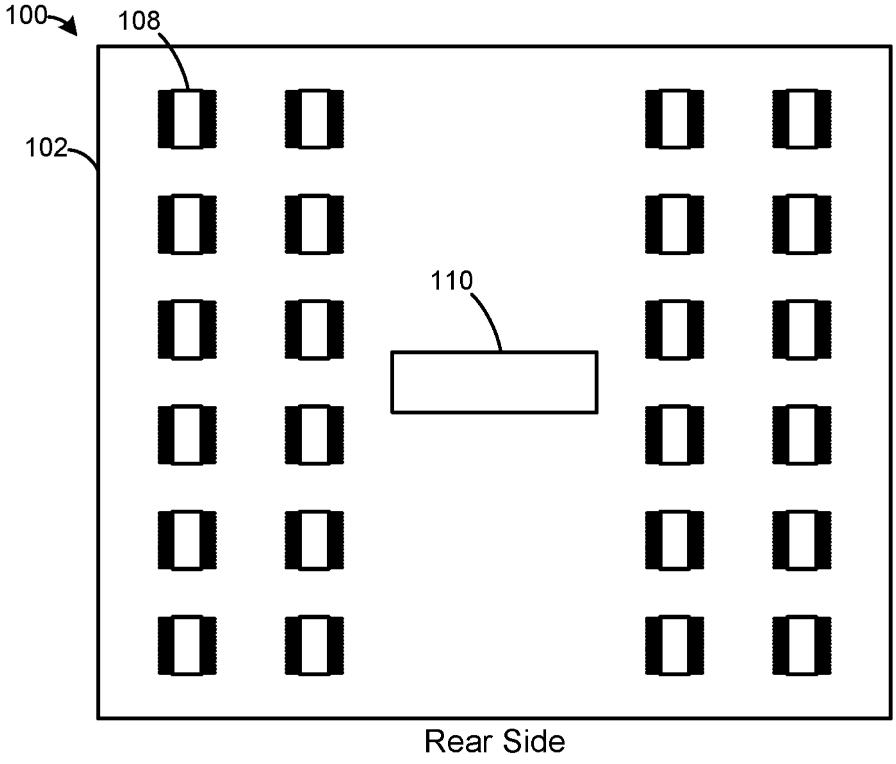
FIG. 1B depicts a rear side schematic view of the example LED display of FIG. 1A, according to the prior art.

Attention is first directed to FIG. 1A and FIG. 1B, which respectively depict front and rear sides of an example light emitting diode (LED) display 100 according to the prior art. The LED display 100 comprises a circuit board 102 onto which a plurality of LED packages 104 are mounted on a front side, as best seen in FIG. 1A. While only one LED package 104 is indicated, it is understood that the LED display 100 comprises eight rows of LED packages 104, with ten LED packages 104 in a row.

A given LED package 104 comprises one red LED 106R, one green LED 106G, and one blue LED 106B. Hereafter, the LEDs 106R, 106G, 106B are interchangeably referred to collectively as the LEDs 106 and generically as an LED 106. This convention will be used throughout the present specification.

As such, a given LED package 104 emits one wavelength of red light, one wavelength of green light, and one wavelength of blue light, though it is understood that such emission of red, green or blue light may be over a given wavelength range, centered on a particular red, green or blue wavelength. Hence, hereafter, reference to an LED 106 emitting one wavelength of light is understood to include such wavelength ranges; similarly, hereafter, reference to two LEDs 106 emitting different wavelengths of light of a same given color is understood to include the two LEDs 106 emitting light of the same given color in different wavelength ranges, which may not overlap.

At a rear side of the LED display 100, as best seen in FIG. 1A, the LED display 100 includes a plurality of ICs 108, each IC 108 for driving respective LEDs 106 of a plurality of LED packages 104. In particular, a number of the ICs 108 is less than a total number of the LED packages 104, such that a given IC 108 drives a plurality of LEDs 106 of a plurality of LED packages 104.

Put another way, one IC 108 is used to drive a grid of LED packages 104, such that the LED packages 104 generally form a passive matrix, and, as such, line scanning is generally used to drive the LEDs 106 of the LED packages 104, which inherently induces line flicker.

Furthermore, in a particular example, an IC 108 may have forty-eight channels to address sixteen RGB LEDs 106 with thirty-two lines, which may require at least eight PCB layers to form the circuit board 102. For example, LED drivers of an IC 108 may, in some examples, address sixteen LEDs (e.g., a 16 channel driver) or forty-eight LEDs (48 channel driver), or even higher numbers of LEDs with higher channel count drivers. In such examples, the LED drivers of the ICs 108 may be electrically connected to a number columns, and also a number of lines (e.g., rows), that may be referred to as a line scan group, that may be as low as 4 lines, or as high as 128 lines, though any suitable number of lines is within the scope of the present specification. As a number of physical LEDs that are connected to the ICs 108 increase, the more complex the PCB layout will become to address the LEDs. PCB layouts could range anywhere from 4 to 12 layers depending on an LED pixel pitch and numbers of columns and lines (e.g., rows).

While only one IC 108 is indicated, it is understood that the LED display 100 comprises six rows of ICs 108, with four ICs 108 in a row. While connections between the ICs 108 and the LED packages 104 (e.g., and/or the LEDs 106) are not depicted for simplicity, and/or may be internal to the circuit board 102, such connections are nonetheless understood to be present. Furthermore, while a given number of ICs 108 are depicted, relative to a respective given number of LED packages 104, an actual number of ICs 108 may depend on a number of LED drivers of the ICs 108, as described above. Put another way, the present specification is understood to include any suitable number ICs 108, relative to a respective given number of LED packages 104, and such a suitable number ICs 108.

It is furthermore understood that the depicted LED display 100 may generally include millions of LED packages 104, for example to achieve a given resolution of an image formed by the LED display 100, with one LED package 104 per pixel of the given resolution, with a number of the ICs 108 adapted accordingly.

As depicted in FIG. 1B, the LED display 100 further comprises an electrical connector 110 located at the rear side. While connections between the electrical connector 110 and the ICs 108 are not depicted for simplicity, and/or may be internal to the circuit board 102, such connections are nonetheless understood to be present. It is understood that the electrical connector 110 may be used to connect the ICs 108 to an external image providing device, such as an image generator and/or an image playing device and/or a video playing device, that generates and/or plays images, and/or generates and/or plays video that is rendered by the LEDs 106 of the LED display 100.

The color space of the LED display 100 is hence limited by the wavelengths of the LEDs 106, and furthermore may be challenging to manufacture as a number of PCBs used to manufacture the LED display 100 may be eight or more, due at least to the complexity of connecting the ICs 108 to the LED packages 104.

Figure 2A:
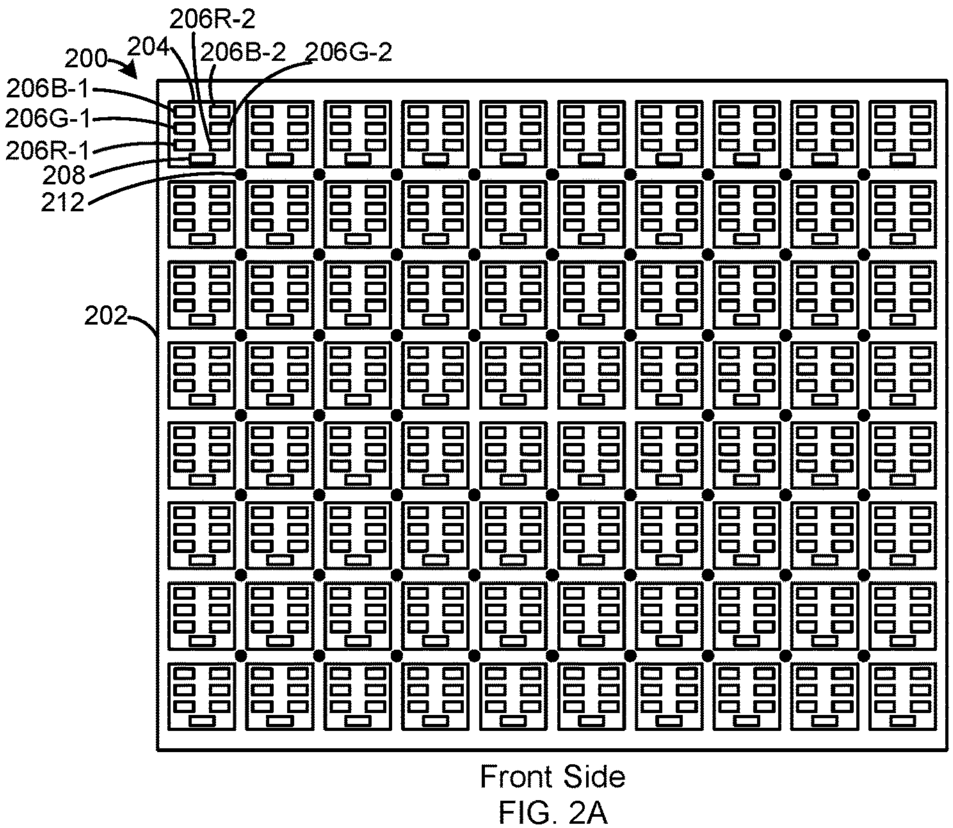
FIG. 2A depicts a front side schematic view of an example LED display with light emitting diode pairs and integrated circuits in LED packages thereof.
Figure 2B:
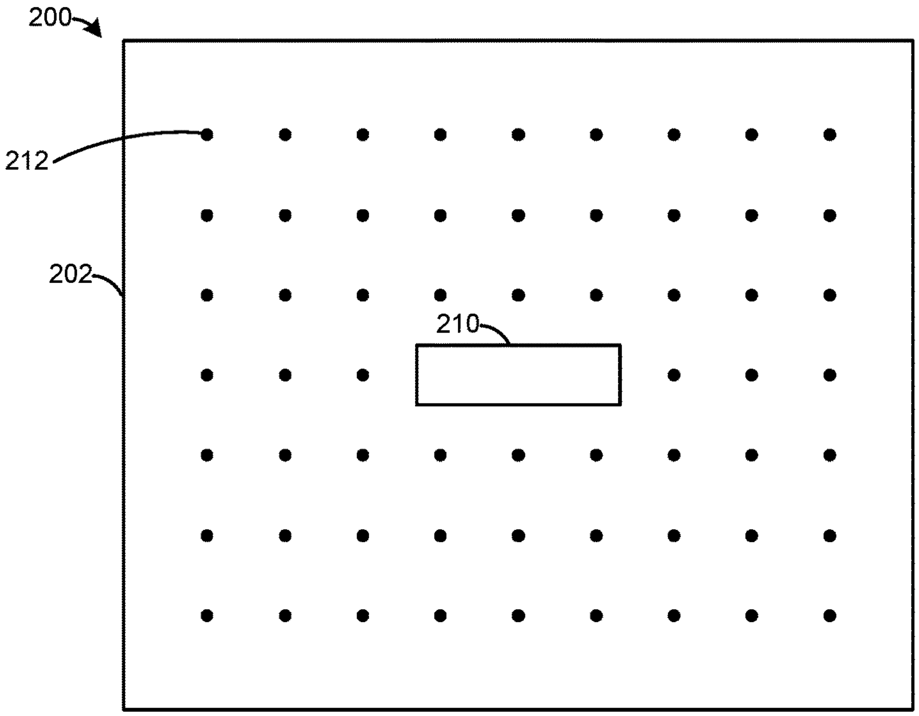
FIG. 2B depicts a rear side schematic view of the example LED display of FIG. 2A.

Attention is first directed to FIG. 2A and FIG. 2B, which respectively depict front and rear sides of an example light emitting diode (LED) display 200, according to present examples.

The LED display 200 comprises a circuit board 202 onto which a plurality of LED packages 204 are mounted on a front side, as best seen in FIG. 2A. While only one LED package 204 is indicated, it is understood that the LED display 200 comprises eight rows of LED packages 204, with ten LED packages 204 in a row. A given LED package 204 comprises a pair of red LEDs 206R-1, 206R-2, a pair of green LEDs 206G-1, 206G-2, and a pair of blue LEDs 206B-1, 206B-2, as well as an IC 208.

Hereafter, the red LEDs 206R-1, 206R-2, are interchangeably referred to collectively as the red LEDs 206R and generically as a red LED 206R. Similarly, the green LEDs 206G-1, 206G-2, are interchangeably referred green to collectively as the green LEDs 206G and generically as a green LED 206G. Similarly, the blue LEDs 206B-1, 206B-2, are interchangeably referred blue to collectively as the blue LEDs 206B and generically as a blue LED 206B. Similarly, the LEDs 206R, 206G, 206B are interchangeably referred to collectively as the LEDs 206 and generically as an LED 206.

Figure 3:
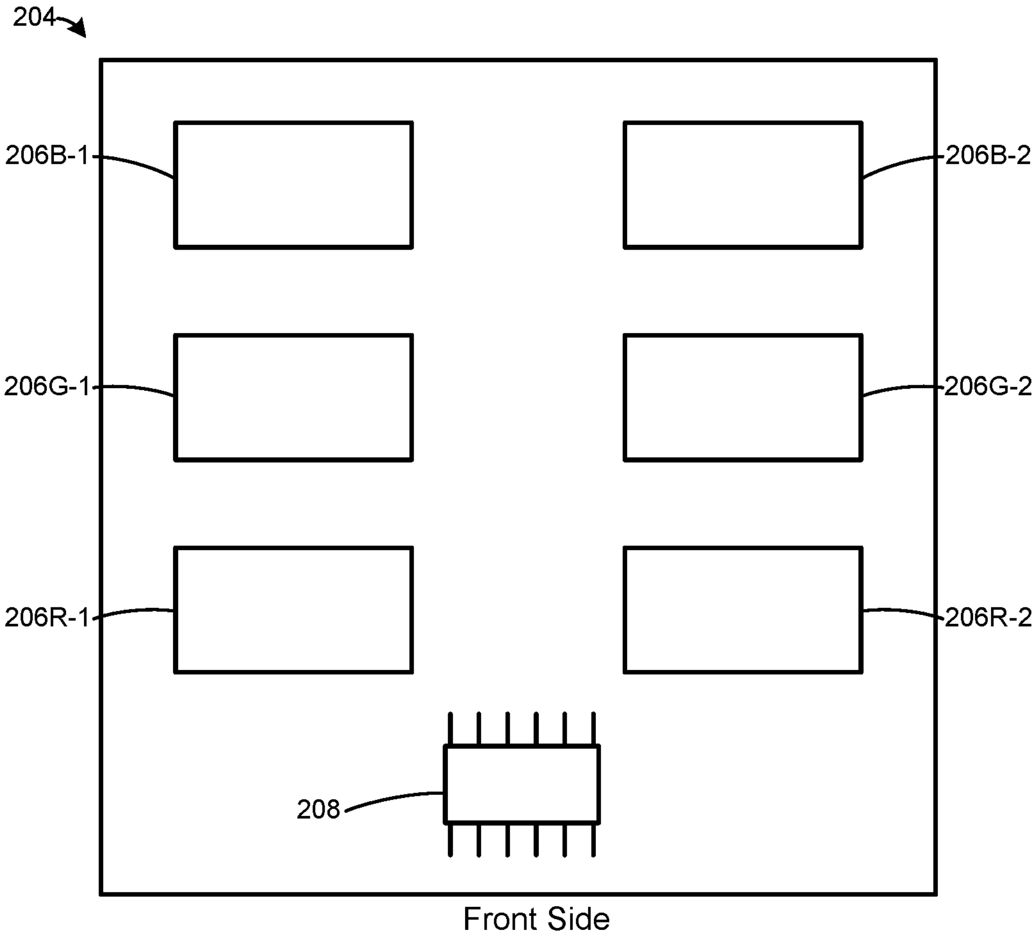
FIG. 3 depicts a front side schematic view of an LED package of the example light emitting diode display of FIG. 2A.
Figure 4:
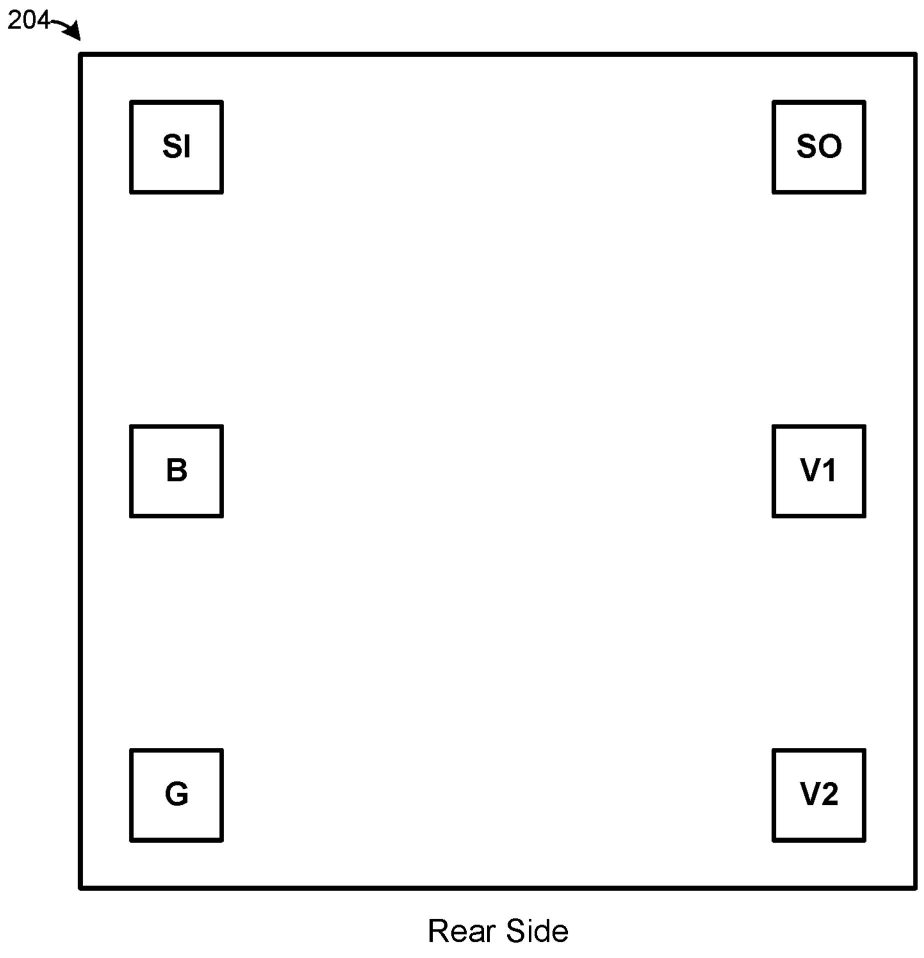
FIG. 4 depicts a rear side schematic view of the LED package of FIG. 3.

Reference will also be made hereafter to FIG. 3 and FIG. 4, which respectively depict front and rear sides of an example LED package 204 according to present examples.

In particular, the LED display 200 comprise a plurality of LEDs packages 204 arranged on the circuit board 202. With reference to FIG. 3, an example LED package 204 comprises: a pair of red LEDs 206R arranged adjacent to one another, the pair of red LEDs 206R configured to emit respective red light at respective different red wavelengths; a pair of green LEDs 206G arranged adjacent to one another, the pair of green LEDs 206G configured to emit respective green light at respective different green wavelengths; and a pair of blue LEDs 206B arranged adjacent to one another, the pair of blue LEDs 206B configured to emit respective blue light at respective different blue wavelengths.

In particular, the LEDs 206 may be arranged respectively adjacent to one another, such that the pair of red LEDs 206R may be next to each other in a row configuration, the pair of green LEDs 206G may be next to each other in a row configuration, and the pair of blue LEDs 206B may be next to each other in a row configuration. However, the LEDs 206 may alternatively be arranged in respective columns. In general, however, a given LED 206 may be adjacent to an LED 206 of a same color such that same colors (though different wavelengths) may have similarly geometric properties relative to a viewer of the LED display 200.

Furthermore, again with reference to FIG. 3, an example LED package 204 further comprises an integrated circuit (IC) 208 configured to independently control the pair red LEDs 206R, the pair of green LEDs 206G and the pair of blue LEDs 206B. Details of the LEDs 206 are described below.

While connections between an IC 208 and LEDs 206 of a given LED package 204 are not depicted for simplicity, and/or may be internal to a given LED package 204, such connections are nonetheless understood to be present.

With reference to FIG. 2B, the LED display 200 further comprises an electrical connector 210 located at the rear side. While connections between the electrical connector 210 and the ICs 208 are not depicted for simplicity, and/or may be internal to the circuit board 202, such connections are nonetheless understood to be present. It is understood that the electrical connector 210 may be used to connect the ICs 208 to an external image providing device (not depicted), such as an image generator and/or an image playing device and/or video playing device, that generates and/or plays images, and/or generates and/or plays video that is rendered by the LEDs 206 of the LED display 200.

In particular, the electrical connector 210 is connected to respective integrated circuits 208 of the plurality of LED packages 204, the electrical connector 210 configured to communicate with an image providing device (not depicted).

While the respective integrated circuits 208 of the plurality of LED packages 204 are depicted as being located at a front side of a respective LED package 204, in other examples, one or more (or all) of the respective integrated circuits 208 may be located at a rear side of a respective LED package 204.

It is furthermore understood that the depicted LED display 200 is may generally include millions of LED packages 204, for example to achieve a given resolution of an image formed by the LED display 200, with one LED package 204 per pixel of the given resolution, with a number of the ICs 208 adapted accordingly. While the LED packages 204 are depicted as a particular shape (e.g., square) and arrangement, the LED packages 204 may be of any suitable shape and arrangement.

Furthermore, a number of the ICs 208 may be the same as a total number of the LED packages 204, such that a given IC 208 drives six LEDs 206 of one LED package 204.

Furthermore, a given IC 208 is hence understood to comprise six output channels, for example one output channel per LED 206.

Again with reference to FIG. 2A and FIG. 2B, the circuit board 202 may further comprise perforations 212 therethrough that permit sound to travel through the circuit board 202. As such, one or more speakers (not depicted) may be mounted behind the LED display 200, and the perforations 212 may enable sound from the one or more speakers to travel through the LED display 200 to an audience. However, the perforations 212 may be optional and traditional sound techniques may be used to provide sound to an audience (e.g., such as audio steering or bouncing technology).

Again with reference to FIG. 2A and FIG. 2B, the circuit board 202 may further comprise the perforations 212 therethrough that permit sound to travel through the circuit board 202, and the perforations may be located between adjacent LED packages 204 other than in a region of the electrical connector 210. In particular, as best seen in FIG. 2A, a given perforation 212 may be located between four adjacent LED packages 204. While a given number and arrangement of perforations 212 are depicted, the LED display 200 may comprise any suitable number and arrangement of perforations 212.

In particular examples, the LED display 200 may have dimensions in range from about 160 mm×120 mm to about 270×270 mm, an LED package 204 may have dimensions in a range from about 0.2 mm×0.2 mm to about 5 mm×5 mm, and a pixel pitch may be in a range of about 2.5 mm to about 5 mm, or larger, (e.g., and may depend on dimensions of an LED package 204). Furthermore, it is understood that the LED display 200 may be combined with other LED displays 200 and assembled into a larger LED display of any suitable dimensions. For example, LED displays 200 of such dimensions may be tiled together to form a larger LED display, for example suitable for cinema environments, simulation environments, and the like, amongst other possibilities. In a particular example, the LED display 200 may be about 0.5 meter by about 0.5 meter, an LED package 204 may be about 1 mm by about 1 mm, and a pixel pitch may be about 2.5 mm.

Attention is next directed to FIG. 4, which depicts a rear side of the LED package 204. In particular, FIG. 4 depicts various contacts to the IC 208 of FIG. 3, that may be connected to the electrical connector 210. In particular, FIG. 4 depicts a serial-in contact SI, a serial-out contact SO, a bypass contact B, a first voltage contact V1, a second voltage contact V2 and a ground connector G.

The serial-in SI and serial-out SO contacts may be used to connect an IC 208 of one LED package 204 to other ICs 208 of other LED packages 204, and a data addressing scheme may be used to control the LEDs 206 of the LED packages 204. For example, each IC 208 of the LED display 200 may be assigned an address, and the image playing device may provide LED driving data for a given address along connected contacts SI, SO of the LED packages 204 via the electrical connector 210. An IC 208 may receive LED driving data for a given address assigned to the IC 208 and drive respective LEDs 206 accordingly.

In some example, the serial-in SI and serial-out SO contacts may provide a single one wire serial interface for the external image providing device via the electrical connector 210 with a common clock. For example, the serial-in SI and serial-out SO contacts may be used to daisy chain the ICs 208 of the LED packages 204 in row and/or columns.

Alternatively, a two wire interface may be used with separate clocks, and a data addressing scheme may be adapted accordingly.

Regardless, of whether a one or two wire serial interface is used, the ICs 208 of the plurality of LED packages 204 may be addressable such that the plurality of LED packages 204 are understood to be arranged in an active matrix, such that the external image providing device may drive the plurality of LED packages 204 independent of each other. As such, line scanning is obviated, reducing and/or eliminating line flicker relative to the LED display 100.

Put another way, LED driving data transmitted along the one or two wire serial interface that is used to drive LEDs 206 of the LED packages 204, may be transmitted (e.g., by the external image providing device) with respective addresses of the LED packages 204 and/or IC 208 that the LED driving data is intended to drive.

Figure 12A:
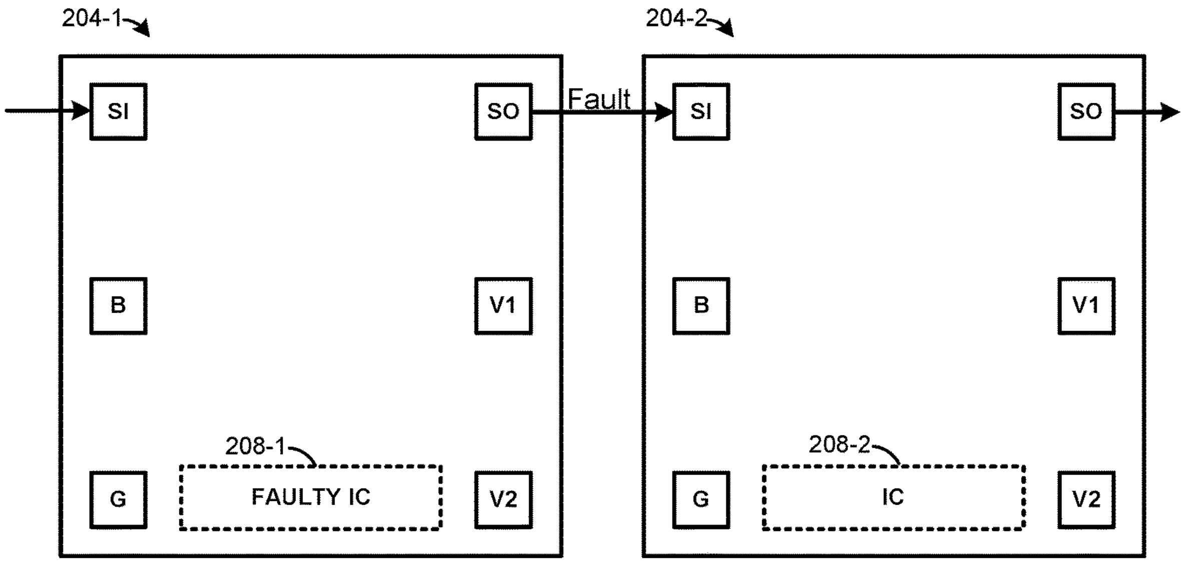
FIG. 12A depicts a rear side of two serially connected LED packages of FIG. 4, with a fault detected at a serial input contact detected at a second LED package of the serially connected LED packages.
Figure 12B:
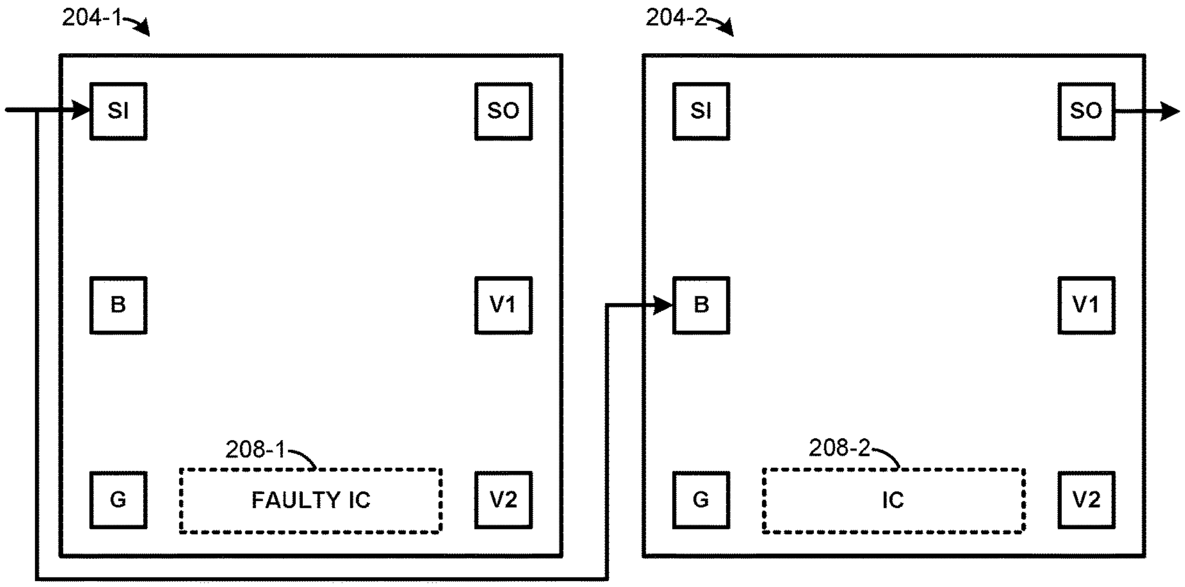
FIG. 12B depicts the serially connected LED packages of FIG. 12A, with a first LED package of the serially connected LED packages bypassed via a bypass contact of the second LED package of the serially connected LED packages.

As depicted, the bypass contact B may be used to bypass a respective LED package 204, for example in the event of failure of one or more of the LEDs 206. For example, attention is briefly directed to FIG. 12A and FIG. 12B, which depict rear sides of two serially connected LED packages 204-1, 204-2, respectively comprising the contacts described with respect to FIG. 4, and respective ICs 208-1, 208-2 (depicted in outline to indicate the respective ICs 208-1, 208-2 are located on a front side of the LED packages 204-1, 204-2). In FIG. 12A and FIG. 12B, the serial-in SI contact of the first LED package 204-1 is receiving a signal from a serial-out SO contact of a previous LED package 204, not depicted, and the serial-in SI contact of the second LED package 204-2 is receiving a respective signal from the serial-out SO contact of the first LED package 204-1; such signals are depicted as single-ended arrows. Furthermore the serial-out SO contact of the second LED package 204-2 is outputting a signal to a serial-in SI contact of a next LED package 204, not depicted.

In particular, in FIG. 12A, the second IC 208-2 detects that the signal received at the serial-in SI contact of the second LED package 204-2 is unstable and/or missing, as indicated by the term "FAULT" on the signal received at the serial-in SI contact of the LED package 204-2. Indeed, in such an example, it is understood that while the signal received at the serial-in SI contact of the second LED package 204-2 is depicted in FIG. 12A, such a signal may be missing. Furthermore, it is understood such a fault detected at the serial-in SI contact of the second LED package 204-2 may be due to the first IC 208-1 of the first LED package 204-1 being faulty (as depicted).

As such, and with reference to FIG. 12B, the IC 208-2 may disconnect the serial-in SI contact of the LED package 204-2 from the serial-out SO contact of the LED package 204-1, and connect the serial-in SI contact of the LED package 204-1 to the bypass from the serial-out SO contact of the LED package 204-1 to the bypass B contact of the second LED package 204-2, for example by opening and closing switches between the various contacts on existing connections therebetween.

Alternatively, or in addition, the ICs 208 of the LED packages 204 may communicate (e.g., and which may include communication with the IC 208 of the LED package 204 from which the signal is received at the serial-in SI contact of the first LED package 204-1) such that the signal received at the serial-in SI contact of the first LED package 204-1 is redirected to the bypass B contact of the second LED package 204-2, that is processed to drive LEDs 206 of the second LED package 204-2. Indeed, such communication may occur to use bypass B contacts to bypass any LED packages 204 where a failure, and the like, is detected.

Put another way, the bypass B contact of the second LED package 204-2 may be used to bypass the first (e.g., previous) LED package 204-1 in a chain of serially connected LED packages 204, due to the faulty signal detected at the serial-in SI contact of the second LED package 204-2. Indeed, such an example illustrates that connections between respective contacts may comprise any suitable type and/or number of connections, and such connections may be via respective ICs 208, and furthermore, such connections may be opened (disconnected) or closed (connected) by respective ICs 208, for example via any suitable number of switched controlled by respective ICs 208.

Returning to FIG. 4, two separate LED voltages may be provided by the external image playing device via the electrical connector 210, to the contacts V1, V2, where the first contact V1 connects a first voltage from the electrical connector 210 to green LEDs 206G and blue LEDs 206B, and the second contact V2 connects a second voltage from the electrical connector 210 to red LEDs 206R. The second voltage may be lower than the first voltage as red LEDs, in general, tend to be driven at lower voltages than green and blue LEDs, which tend to be driven at same or similar voltages. Furthermore, the voltages may be supplied by the external image providing device via the electrical connector 210 or any other suitable device (e.g., a voltage providing device that be the same as, or different from, the external image providing device).

While FIG. 4 depicts a particular number and arrangement of connections to the IC 208, it is understood that the number and arrangement of connections to the IC 208 may be any suitable number and/or arrangement and/or configuration.

Furthermore, it is understood that the circuit board 202 of the LED display 200 may require as few as two PCB layers due to the simplified connections to the electrical connector 210 to the ICs 208, relative to the connections to the ICs 108 of the circuit board 102 of the LED display 100, which allows for more relative unused PCB area. Such unused PCB area may enable a density of the perforations 212 that in turn enable sound transparency of the aforementioned speakers through the circuit board 202.

Furthermore, due to a reduction in a number of the PCB layers, relative to the circuit board 102 of the LED display 100, the circuit board 202 may be formed from flexible material, such that the LED display 200 and/or may be curved, and the like.

Furthermore, two PCB layers of the circuit board 202 are understood to be easier to assemble than the eight PCB layers of the circuit board 102.

Figure 5:
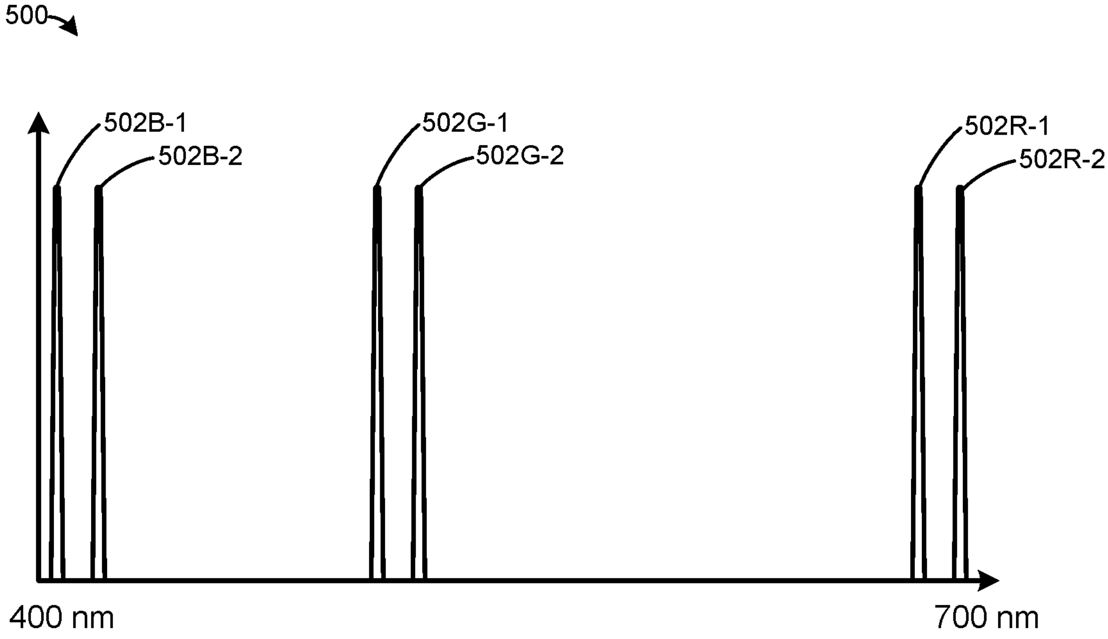
FIG. 5 depicts a graph showing example wavelengths emitted by LEDs of the LED package of FIG. 3.

Attention is next directed to FIG. 5, which depicts a graph 500 showing example wavelengths emitted by the LEDs 206.

For example, as depicted, the first red LED 206R-1 may emit red light at a first red wavelength 502R-1, and the second red LED 206R-2 may emit red light at a second red wavelength 502R-2 (e.g., red wavelengths 502R and/or a red wavelength 502R). It is understood that the red wavelengths 502R are generally in a "red" wavelength region, such as between about 620 nm and about 750 nm.

Similarly, as depicted, the first green LED 206G-1 may emit green light at a first green wavelength 502G-1, and the second green LED 206G-2 may emit green light at a second green wavelength 502G-2 (e.g., green wavelengths 502G and/or a green wavelength 502G). It is understood that the green wavelengths 502G are generally in a "green" wavelength region, such as between about 495 nm and about 570 nm.

Similarly, as depicted, the first blue LED 206B-1 may emit blue light at a first blue wavelength 502B-1, and the second blue LED 206B-2 may emit blue light at a second blue wavelength 502B-2 (e.g., blue wavelengths 502B and/or a blue wavelength 502B). It is understood that the blue wavelengths 502B are generally in a "blue" wavelength region, such as between about 380 nm and about 495 nm.

In particular, the exact values of the wavelengths 502R, 502G, 502B may be selected such that, in combination, the LEDs 206 define a color gamut of a given color space, such as the REC2020 color space, amongst other possibilities.

Furthermore, as depicted, the pairs of red wavelengths 502R, the pairs of green wavelengths 502G, and the pairs of blue wavelengths 502B may each be separated by about nm, peak-to-peak, for example such that the LED display 200 may be operated in a 3D mode, presuming that a corresponding left lens of 3D glasses are configured to respectively transmit the wavelengths 502R-1, 502G-1, 502B-1 while blocking or reflecting the wavelengths 502R-2, 502G-2, 502B-2, and a corresponding right lens of the 3D glasses are configured to respectively transmit the wavelengths 502R-2, 502G-2, 502B-2 while blocking or reflecting the wavelengths 502R-1, 502G-1, 502B-1 (or vice versa).

Such wavelength separation may be achieved in any suitable manner, including, but not limited to, using quantum dots incorporated into the LEDs 206 during manufacture thereof, epitaxial growth of the LEDs 206 during manufacture thereof, amongst other possibilities.

In this manner, the LED display 200 may be operated in at least two modes: a first mode comprising an expanded color gamut mode, in which the pairs of red wavelengths 502R, the pairs of green wavelengths 502G, and the pairs of blue wavelengths 502B may be used to define the REC2020 color space, and the like; and a second mode comprising a 3D mode, in which the pairs of red wavelengths 502R, the pairs of green wavelengths 502G, and the pairs of blue wavelengths 502B may be used to provide left and right 3D images, and the like, but at a reduced color gamut relative to the expanded color gamut mode.

Put another way, the respective different red wavelengths 502R, the respective different green wavelengths 502G and the respective different blue wavelengths 502B may selected to meet the ITU-R (International Telecommunication Union-Radiocommunication Sector) Recommendation BT (Broadcast Television).2020 color space.

Alternatively, or in addition, the respective different red wavelengths 502R, the respective different green wavelengths 502G and the respective different blue wavelengths 502B may be each selected to be at least 20 nm apart, such that the LED display 200 may be operated in a 3D mode.

Hence, when the LED display 200 is installed, for example in a cinema environment, the LED display 200 may be operated in the first mode or the second mode depending on whether video being provided to the LED display 200 includes images and/or video in the REC2020 color space, or 3D images and/or 3D video. Hence, the LED packages 204 provide versatility in presenting images and/or video, Other types of LED packages are within the scope of the present specification.

For example, some LED displays may be used in transportation simulators, including, but not limited to, avionics simulators, land vehicle simulators, aquatic vehicle simulators, and the like. In certain types of simulators, night vision goggles (NVGs) may be used, for example to simulate use of NVGs in real world environments. However, with reference to FIG. 5, RGB LEDs as provided herein, don't generally emit infrared (IR) light that is detected and rendered by NVGs.

Furthermore, it has been heuristically determined that IR images in simulators that are used with NVGs, do not generally require the same spatial resolution as RGB images.

Hence, provided herein is another example LED package that includes a plurality of groups of RGB LEDs and an IR LED. The plurality of groups of RGB LEDs may be used to form RGB images in a wavelength range visible to humans without an NVG (e.g., from about 380 nm to about 750 nm), and the IR LED may be used to provide corresponding, lower resolution, IR images detectable by NVGs. As a groups of RGB LEDs will generally correspond to a pixel of an RGB image, and as the IR LED will generally correspond to a pixel of a corresponding IR image, it is understood that, given a ratio of "N" numbers of groups of RGB LEDs to one IR LED in an LED package, RGB images will generally have a resolution and/or a number of pixels that is N times a resolution of a corresponding IR image.

Figure 6:
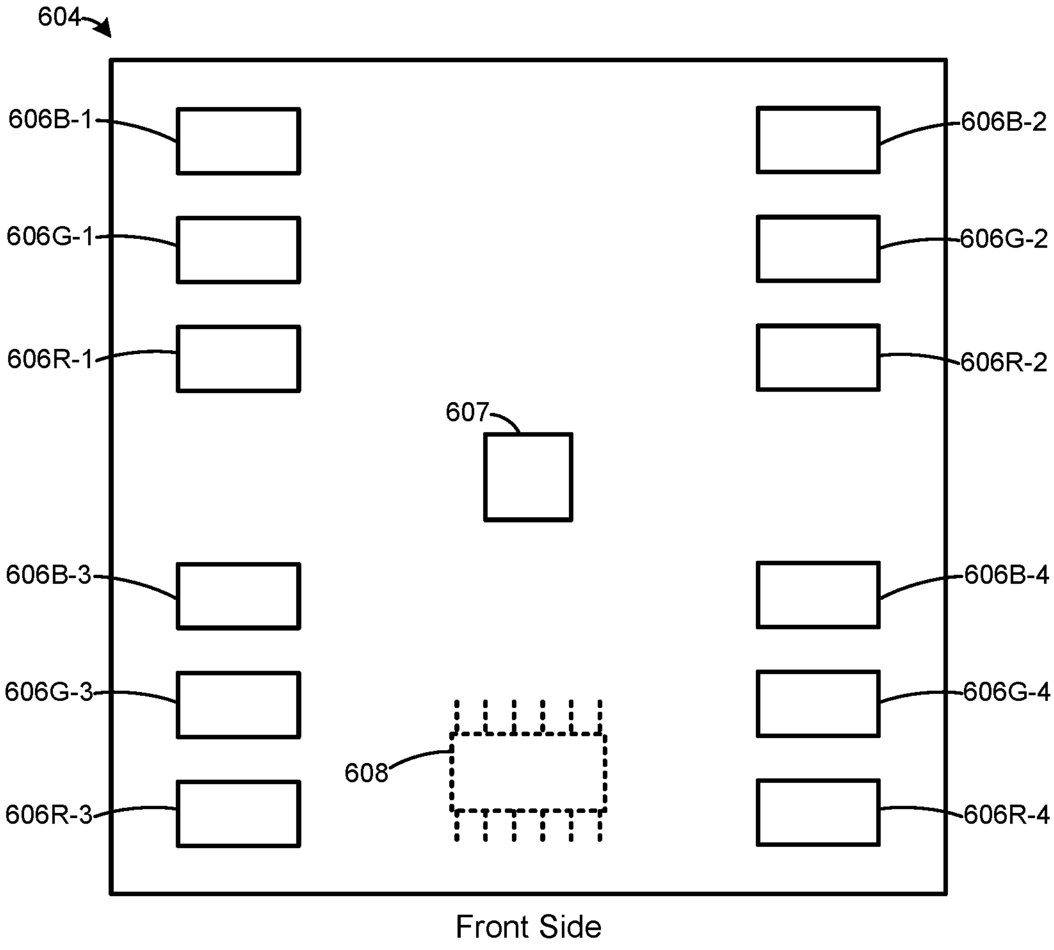
FIG. 6 depicts a front side schematic view of an example alternative LED package that may be used with the LED display of FIG. 1A and FIG. 1B, or with the LED display of FIG. 2A and FIG. 2B, and that includes a plurality of groups of RGB LEDs and an infrared LED, and optionally an integrated circuit.

For example, attention is next directed to FIG. 6, which depicts a front side of an alternative LED package 604 that may be used with the LED display 100 of FIG. 1A and FIG. 1B, or with the LED display 200 of FIG. 2A and FIG. 2B. However, as will be presently described, when the LED package 604 is used with the LED display 100 of FIG. 1A and FIG. 1B. the LED package 604 may exclude a respective IC, and, when the LED package 604 is used with the LED display 200 of FIG. 2A and FIG. 2B. the LED package 604 may include a respective IC.

Put another way, the LED package 604 may be component of a device (e.g., the LED display 100 or the LED display 200) comprising: a circuit board (e.g., the circuit board 102 or the circuit board 202); a plurality of light emitting diode (LED) packages 604 arranged on the circuit board; and an electrical connector (e.g., the electrical connector 110 or the electrical connector 210) connected to LEDs of the plurality of LED packages 604, the electrical connector configured to communicate with an image providing device, as has been previously described.

In particular, as depicted, the LED package 604 comprises: a first group of a red LED 606R-1, a green LED 606G-1, and a blue LED 606B-1; a second group of a red LED 606R-2, a green LED 606G-2, and a blue LED 606B-2; a third group of a red LED 606R-3, a green LED 606G-3, and a blue LED 606B-3; and a fourth group of a red LED 606R-4, a green LED 606G-4, and a blue LED 606B-4.

The first group of LEDs 606R-1, 606G-1, 606B-1 are interchangeably referred to hereafter, collectively as the first group of LEDs 606-1. The second group of LEDs 606R-2, 606G-2, 606B-2 are interchangeably referred to hereafter, collectively as the second group of LEDs 606-2. The third group of LEDs 606R-3, 606G-3, 606B-3 are interchangeably referred to hereafter, collectively as the third group of LEDs 606-3. The fourth group of LEDs 606R-4, 606G-4, 606B-4 are interchangeably referred to hereafter, collectively as the fourth group of LEDs 606-4

The red LEDs 606R-1, 606R-2, 606R-3, 606R-4 are interchangeably referred to hereafter as the red LEDs 606R, the green LEDs 606G-1, 606G-2, 606G-3, 606G-4 are interchangeably referred to hereafter as the green LEDs 606G, and the blue LEDs 606B-1, 606B-2, 606B-3, 606B-4 are interchangeably referred to hereafter as the blue LEDs 606B.

Furthermore, the LEDs 606R, 606G, 606B are interchangeably referred to hereafter as the LEDs 606 and/or an LED 606.

The red LEDs 606R, the green LEDs 606G and the blue LEDs 606B may emit light at respective wavelengths 502R-1, 502G-1, 502B-1, or at respective wavelengths 502R-2, 502G-2, 502B-2, or at any suitable wavelengths in, respectively, a red wavelength range, a green wavelength range and a blue wavelength range.

The IR LED 607 may be configured to emit infrared light in an infrared wavelength range, such as in a range of about 750 nm to about 1000 nm. In a particular example, the IR LED 607 may emit infrared light of about 800 nm.

Regardless, as depicted, the LED package 604 comprises: a plurality of groups of red, green and blue (RGB) LEDs 606; and an infrared LED 607, the plurality of groups of RGB LEDs 606 and the infrared LED 607 being in a least a two-to-one ratio.

Put another way, while as depicted, the plurality of groups of RGB LEDs 606 and the infrared LED 607 is in a four-to-one ratio, the LED package 604 may include as few as two groups of RGB LEDs 606.

However, as depicted, at the LED package 604, the plurality of groups of RGB LEDs 606 and the infrared LED 607 may be in a four-to-one ratio, and the plurality of groups of RGB LEDs 606 may be located at respective corners of a square (e.g., as depicted) or a rectangle, and the infrared LED 607 may be located in about a center of the square or the rectangle.

However, when the LED package 604 comprises two groups of RGB LEDs 606, the plurality of groups of RGB LEDs 606 may be located along a line, and the infrared LED 607 may be located about midway between the two groups of RGB LEDs 606 along the line.

However, when the LED package 604 comprises three groups of RGB LEDs 606, the plurality of groups of RGB LEDs 606 may be located at respective corners of a triangle (e.g., an equilateral triangle), and the infrared LED 607 may be located at about a center of the triangle.

Put another way, when the LED package 604 comprises, three or four or more groups of RGB LEDs 606, the plurality of groups of RGB LEDs 606 may be located at respective corners of a corresponding polygon with a same number of sides and corners as the number of LED packages 604, and the infrared LED 607 may be located at about a center of the polygon.

Indeed, such symmetry of the LEDs 606 and the IR LED 607 may provide the LEDs 606 and the IR LED 607 with similar geometric properties relative to a viewer of an LED display into which the LED packages 604 are incorporated. Such symmetries and/or a ratio of the LEDs 606 to the IR LED 607 may offer a cost advantage in laying out and manufacturing the LED packages 604.

The LED package 604 may or may not include a respective integrated circuit 608. As such, the integrated circuit 608 depicted in FIG. 6 is understood to be optional and is hence depicted in broken lines.

When the LED package 604 does not include a respective integrated circuit 608, the LED package 604 may be integrated into the LED display 100, for example in place of the LED packages 104, and LEDs 606, 607 thereof are understood to be driven by an IC 108, the ICs 108 adapted to drive four groups of RGB LEDs 606 (or any suitable number of groups of RGB LEDs 606) and one IR LED 607, per LED package 604.

However, when the LED package 604 comprises the IC 608, the LED package 604 may be integrated into the LED display 200, and LEDs 606, 607 of a respective LED package 604 thereof are understood to be driven by a respective IC 608.

Put another way, when the LED package 604 comprises the IC 608, the IC 608 may be configured to independently control the plurality of groups of RGB LEDs 606 and the infrared LED 607, and the electrical connector 210 of the LED display 200 may be connected to the LEDs 606, 607 of the plurality of LED packages 204 of the LED display 200 via respective integrated circuits 608 of the plurality of LED packages 604.

Examples will now be described in which the LED package 604 does not include the IC 608. In these examples, the groups of RGB LEDs 606 may be driven in a passive matrix format using one or more of the ICs 208, adapted to drive the groups of RGB LEDs 606 of the LED package 604 in either a row configuration or a column configuration.

In particular, in order to reduce input/output signals for illuminating the depicted the groups of RGB LEDs 606 and the IR LED 607, in some examples, only two groups of RGB LEDs 606 (e.g., two RGB pixels) may be driven and/or illuminated at the same time, either in a row configuration (e.g., horizontally) or a column node (e.g., vertically), while the IR LED 607 is controlled independently.

Figure 7:
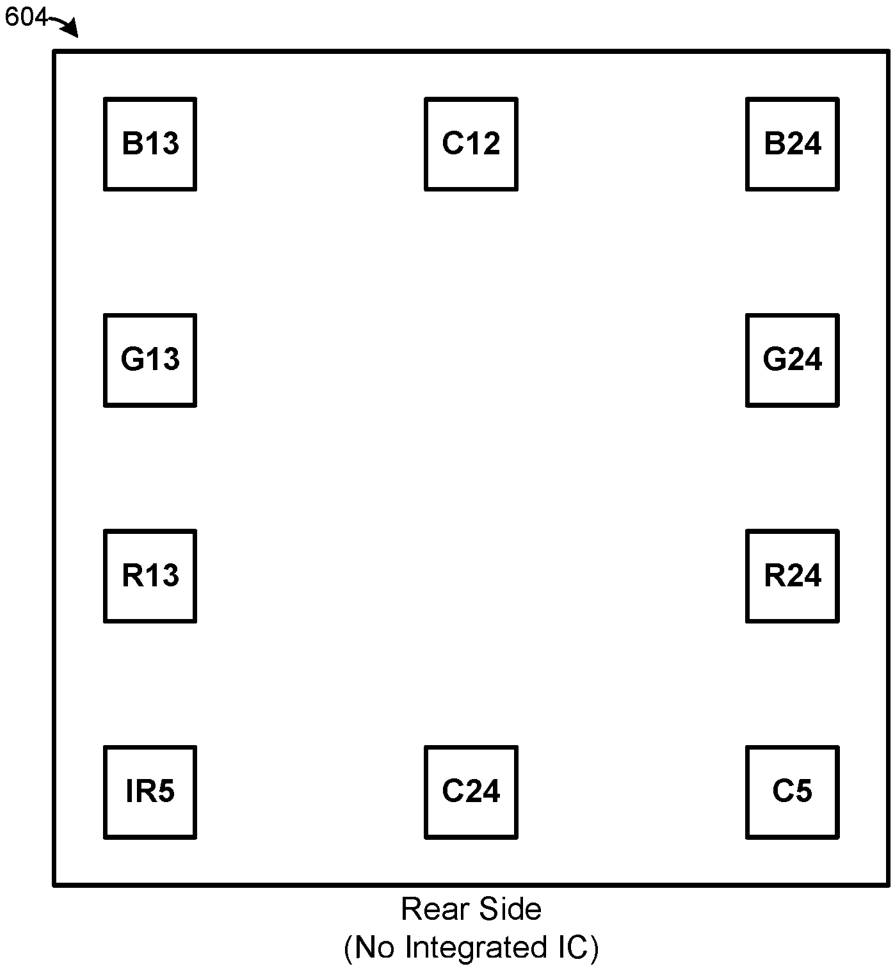
FIG. 7 depicts a rear side schematic view of the example alternative LED package of FIG. 6 when the example alternative LED package of FIG. 6 excludes an integrated circuit.

For example, attention is next directed to FIG. 7, which depicts a rear side of the LED package 604 of FIG. 6 when the LED package 604 does not include the IC 608. In particular, FIG. 7 depicts nine example contacts to the LEDS 606, 607, the contacts labelled as R13, G13, B13, C13, R24, G24, B24, C24, C5 and IR5. Such contacts may be used to drive the RGB LEDs 606 in a row configuration or a column node, and the IR LED 607 independent of the RGB LEDs 606, depending on a circuit of the LED package 604.

Figure 8:
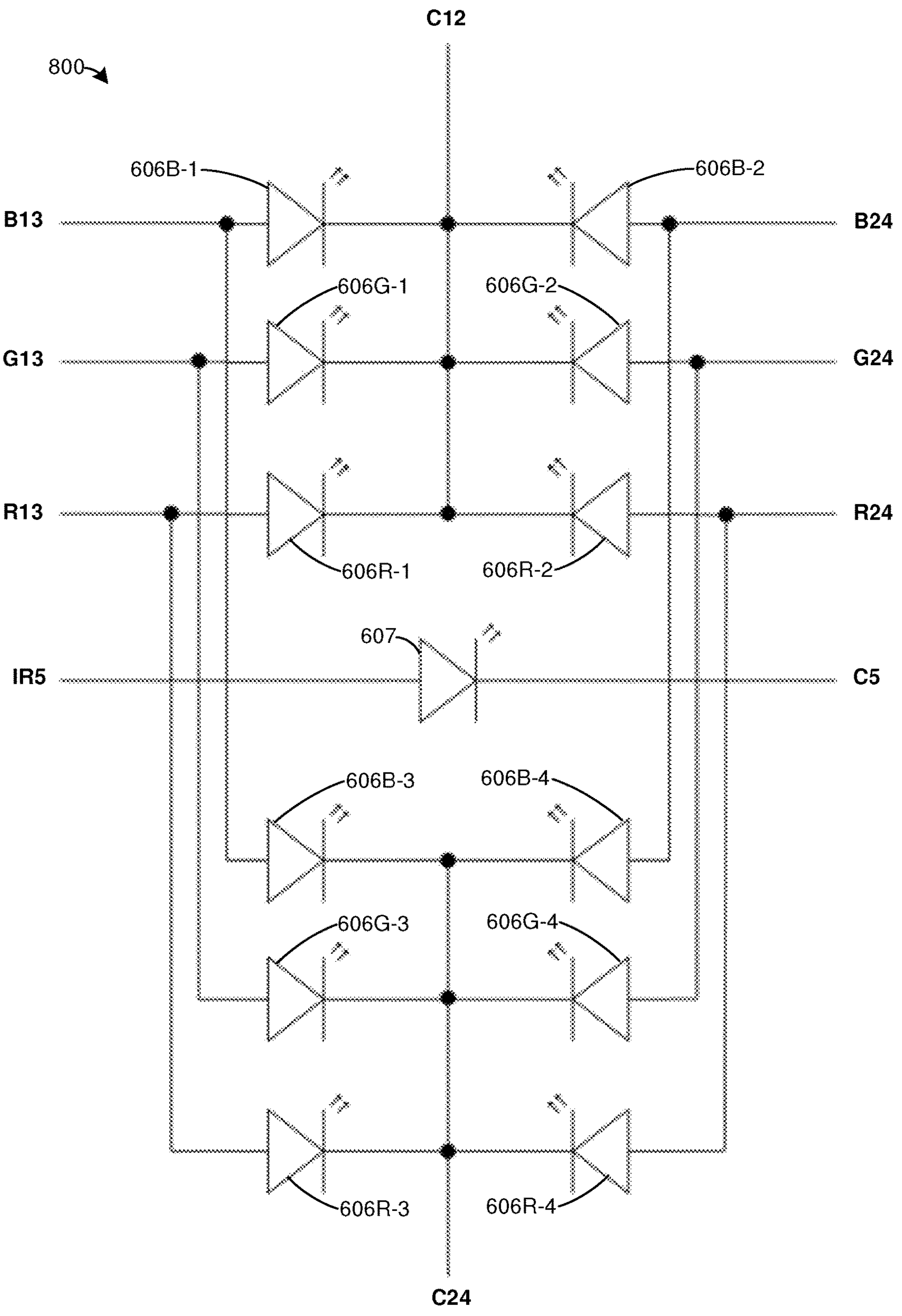
FIG. 8 depicts a circuit for driving the LEDs of the example alternative LED package of FIG. 6 in a row configuration, when the example alternative LED package of FIG. 6 excludes an integrated circuit.

For example, attention is next directed to FIG. 8, which depicts a circuit 800 that may be embedded in the LED package 604, showing connections from the nine contacts R13, G13, B13, C13, R24, G24, B24, C24, C5, IR5 to the RGB LEDs 606 and the IR LED 607, to drive the RGB LEDs 606 in a row configuration. In particular, the LEDs 606, 607 are depicted as transistors, and contacts R13, G13, B13, C13, R24, G24, B24, C24, C5, IR5 may be used to drive the pair of RGB LEDs 606-1, 606-2 or the pair of RGB LEDs 606-3, 606-4, as well as the IR LED 607.

Figure 9:
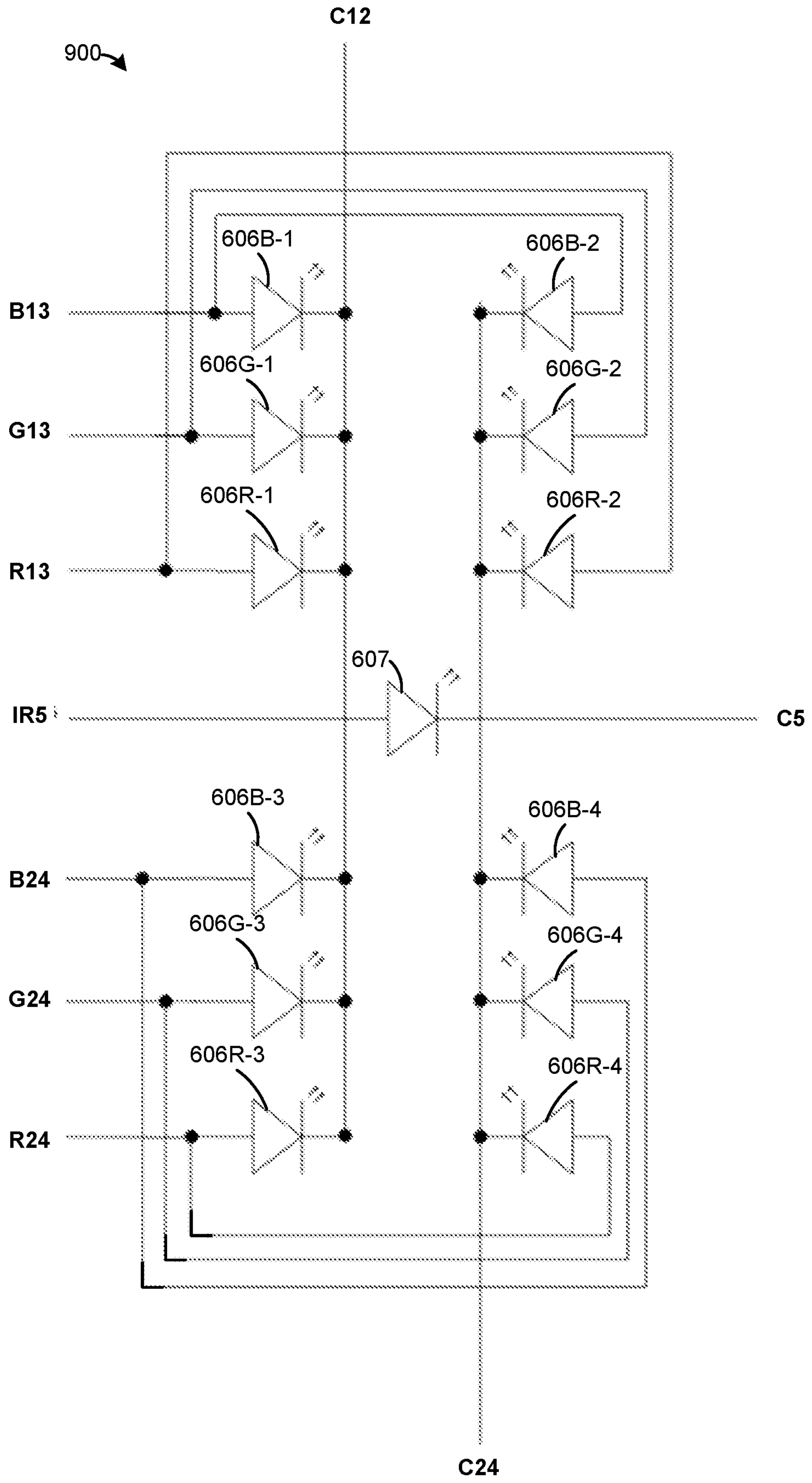
FIG. 9 depicts a circuit for driving the LEDs of the example alternative LED package of FIG. 6 in a column configuration, when the example alternative LED package of FIG. 6 excludes an integrated circuit.

In contrast, attention is next directed to FIG. 9, which depicts a circuit 900 embedded that may be embedded in the LED package 604, showing connections from the nine contacts R13, G13, B13, C13, R24, G24, B24, C24, C5, IR5 to the RGB LEDs 606 and the IR LED 607, to drive the RGB LEDs 606 in a column configuration. In particular, the LEDs 606, 607 are depicted as transistors, and contacts R13, G13, B13, C13, R24, G24, B24, C24, C5, IR5 may be used to drive the pair of RGB LEDs 606-1, 606-3 or the pair of RGB LEDs 606-2, 606-4, as well as the IR LED 607.

In general, the LED package 604 may include the circuit 800 or the circuit 900.

Alternatively, when the IC 608 is included in the LED package 604, a rear side of the LED package 604 may be the same as, or similar, the rear side of the LED package 204 as depicted in FIG. 4, with contacts SI, SO, B, V1, V2 and G used in a manner similar to as described with reference to FIG. 4. In these examples, it is understood that any suitable data addressing scheme may be used to individually control the LEDs 606, 607. It is further understood, in these examples, that the IC 608 is adapted to include at least a same number of outputs as the number of LEDs 606, 607; for example, with reference to FIG. 6, when the LED package 604 includes four groups of RGB LEDs 606 and the IR LED 607, the IC 608 may include at least thirteen outputs (e.g., for each of the three RGB LEDs 606 of each of the four groups thereof, as well as the IR LED 607).

It is further understood that when the LED package 604 includes the IC 608, a size of the LED package 604 may be smaller than when the LED package 604 excludes the IC 608.

For example, in the depicted examples where the LED package 604 excludes the IC 608, a pitch between the groups RGB LEDs 606 may be about 4 mm or less than about 4 mm.

However, in the depicted examples where the LED package 604 includes the IC 608, a pitch between the groups RGB LEDs 606 may be about 1 mm or less than about 1 mm.

When the LED package 604 excludes the IC 608, a size of the LED package 604 is adapted to include the circuit 800 or the circuit 900; whereas, when the LED package 604 includes the IC 608, a size of the LED package 604 may be reduced as connections only between the contacts SI, SO, B, V1, V2 and G and the LEDs 606, 607 may require relatively less space. Furthermore, in examples where the LED package 604 includes the IC 608, a circuit board of an LED display into which the LED package 604 are integrated, such as the LED display 200, may include the perforations 212 for sound transparency therethrough.

It is further understood that the LED packages described herein may support a flexible assembly approach, accommodating both flip-chip and wire-bond chip types, or a mixture of both within the same LED package. Furthermore, both flip-chip and wire-bond configurations allow for seamless integration and optimized electrical connections, which may lead to efficient control and functionality of each LED channel.

Furthermore, while the LED packages described herein may be used in cinema and/or simulator environments, at least some LED packages described herein may be used in any suitable environment where high density LED displays (e.g., pixel pitch below 2.0 mm) are required and/or in night vision simulator environments where LED displays with effective resolution below 4.0 mm are required, and/or in general lighting applications.

Furthermore, various features of LED packages as described herein may be combined in any suitable manner.

Figure 10:
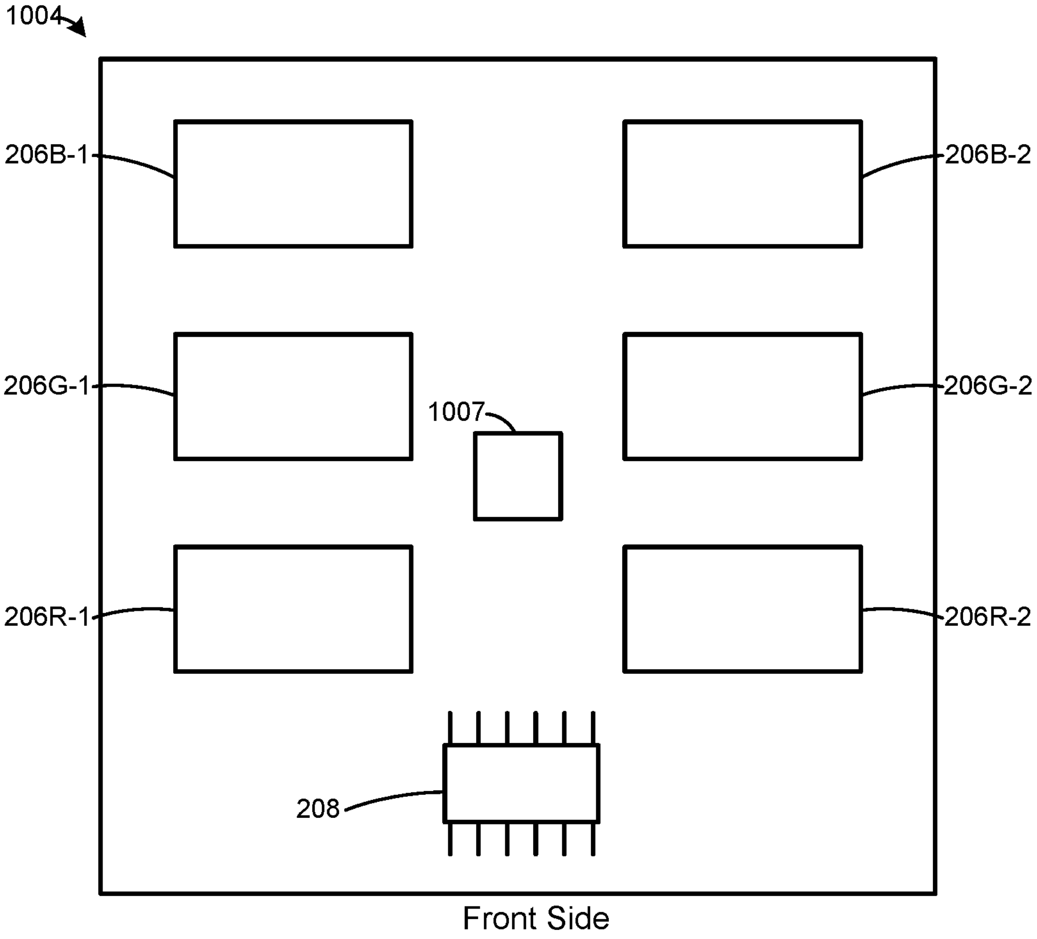
FIG. 10 depicts a front side schematic view of an example alternative LED package with light emitting diode pairs, an integrated circuit, and an infrared LED.

For example, with reference to FIG. 10, a front side of an LED package 1004 is depicted, that is substantially similar to the LED package 204, with like components having like numbers, but adapted to include an IR LED 1007. Hence, the LED package 1004 may be operated in at least three modes.

For example the LED package 1004 may be operated in a first mode, comprising an expanded color gamut mode, in which the pairs of red wavelengths 502R, the pairs of green wavelengths 502G, and the pairs of blue wavelengths 502B may be used to define the REC2020 color space, and the like.

Furthermore, the LED package 1004 may be operated in a second mode, comprising a 3D mode, in which the pairs of red wavelengths 502R, the pairs of green wavelengths 502G, and the pairs of blue wavelengths 502B may be used to provide left and right 3D images, and the like, but at a reduced color gamut relative to the expanded color gamut mode.

Furthermore, the LED package 1004 may be operated in a third mode, comprising an IR mode, in which the IR LED 1007 is used to form an IR image that is the same as, or similar to, RGB images formed by the RGB LEDS 206. Alternatively, or in addition, the IR mode may be combined with the expanded color gamut mode, with the IR LED 1007 operating simultaneously with the RGB LEDS 206 operating in the expanded color gamut mode. Alternatively, or in addition, the IR mode also may be combined with the 3D mode, with the IR LED 1007 operating simultaneously with the RGB LEDS 206 operating in the 3D mode.

Alternatively, or in addition, the LED package 604 may be adapted to included pairs of RGB LEDs similar to the LED package 204. For example, with reference to FIG. 11, a front side of an LED package 1104 is depicted, that is substantially similar to the LED package 604, with like components having like numbers, but adapted to include pairs of LEDs 606, as is next described.

Figure 11:
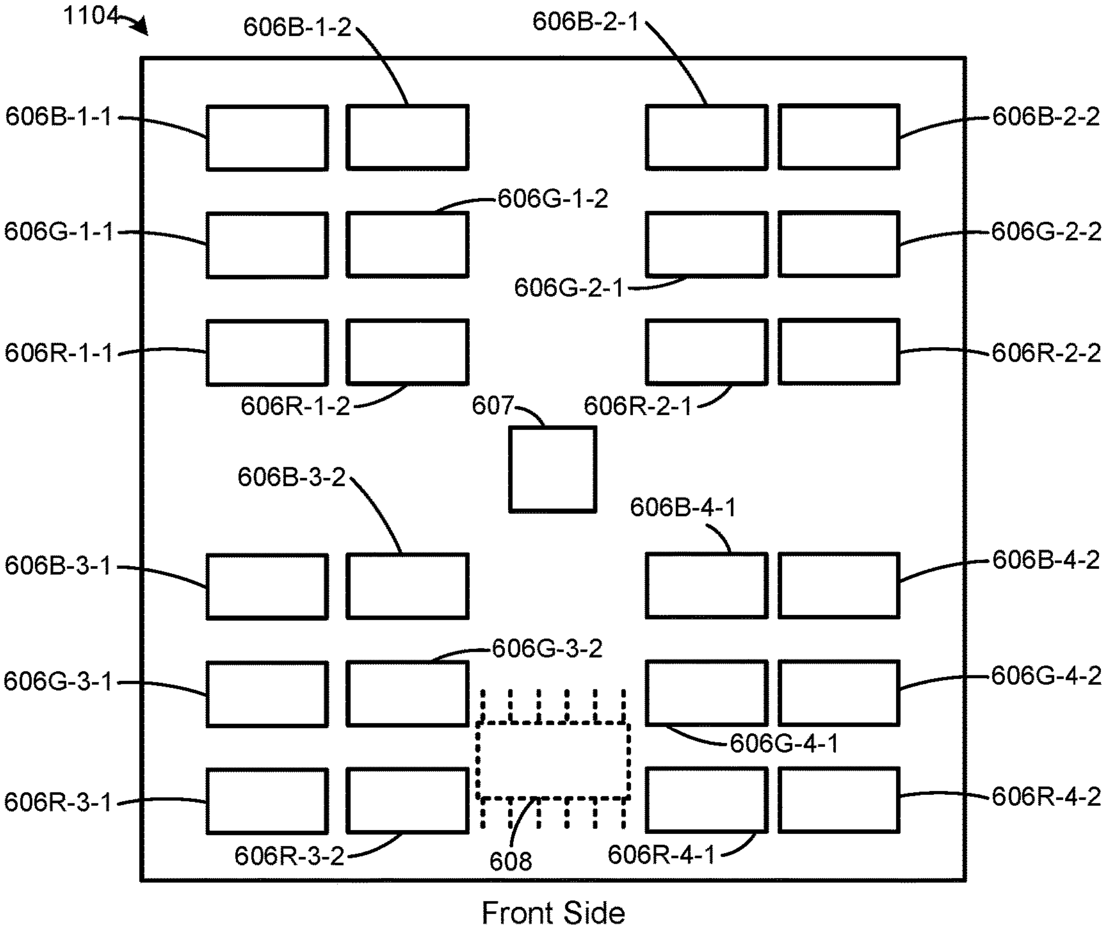
FIG. 11 depicts a front side schematic view of an example alternative LED package with a plurality of groups of light emitting diode pairs, an infrared LED, and an optional integrated circuit.

For example, as depicted in FIG. 11, and with reference to FIG. 5, the groups of RGB LEDs 606 include a first group comprising: a pair of red LEDs 606R-1-1, 606R-1-2, for example configured to emit the respective wavelengths 502R-1, 502R-2; a pair of green LEDs 606G-1-1, 606G-1-2, for example configured to emit the respective wavelengths 502G-1, 502G-2; and a pair of blue LEDs 606B-1-1, 606B-1-2, for example configured to emit the respective wavelengths 502B-1, 502B-2.

Similarly, the groups of RGB LEDs 606 include a second group comprising: a pair of red LEDs 606R-2-1, 606R-2-2, for example configured to emit the respective wavelengths 502R-1, 502R-2; a pair of green LEDs 606G-2-1, 606G-2-2, for example configured to emit the respective wavelengths 502G-1, 502G-2; and a pair of blue LEDs 606B-2-1, 606B-2-2, for example configured to emit the respective wavelengths 502B-1, 502B-2.

Similarly, the groups of RGB LEDs 606 include a third group comprising: a pair of red LEDs 606R-3-1, 606R-3-2, for example configured to emit the respective wavelengths 502R-1, 502R-2; a pair of green LEDs 606G-3-1, 606G-3-2, for example configured to emit the respective wavelengths 502G-1, 502G-2; and a pair of blue LEDs 606B-3-1, 606B-3-2, for example configured to emit the respective wavelengths 502B-1, 502B-2.

Similarly, the groups of RGB LEDs 606 include a fourth group comprising: a pair of red LEDs 606R-4-1, 606R-4-2, for example configured to emit the respective wavelengths 502R-1, 502R-2; a pair of green LEDs 606G-4-1, 606G-4-2, for example configured to emit the respective wavelengths 502G-1, 502G-2; and a pair of blue LEDs 606B-4-1, 606B-4-2, for example configured to emit the respective wavelengths 502B-1, 502B-2.

The LED package 1104 may or may not include the IC 608. When the LED package 1104 does not include the IC 608, the LED package 1104 may include one of the circuits 800, 900, but adapted to control the twenty four RGB LEDs 606 and the IR LED 607 of the LED package 1104, with the contacts on the rear side of the LED package 1104 adapted accordingly relative to the contacts of FIG. 7. In particular, the IC 608 may be adapted to include at least a same number of outputs as the number of LEDs 606, 607.

When the LED package 1104 includes the IC 608, the LED package 1104 excludes a circuit 800, 900, and the IC 608 is adapted to control the control twenty four RGB LEDs 606 and the IR LED 607 using any suitable data addressing scheme.

Like the LED package 1004, the LED package 1104 may be operated in at least three modes: the aforementioned expanded color gamut mode, the aforementioned 3D mode, and the aforementioned IR mode, that may be optionally combined with one or more of the expanded color gamut mode and the 3D mode.

Hence, provided herein are devices and/or LED displays that may include various types of LED packages for use in cinema environments, simulation environments, and/or any other suitable environments.

It is further understood that instance of the term "configured to", such as "a computing device configured to . . . ", "a processor configured to . . . ", "a controller configured to . . . ", and the like, may be understood to include a feature of a computer-readable storage medium having stored thereon program instructions that, when executed by a computing device and/or a processor and/or a controller, and the like, may cause the computing device and/or the processor and/or the controller to perform a set of operations which may comprise the features that the computing device and/or the processor and/or the controller, and the like, are configured to implement. Hence, the term "configured to" is understood not to be unduly limiting to means plus function interpretations, and the like.

Furthermore, descriptions of one processor and/or controller and/or device and/or engine, and the like, configured to perform certain functionality is understood to include, but is not limited to, more than one processor and/or more than one controller and/or more than one device and/or more than one engine, and the like performing such functionality.

It is understood that for the purpose of this specification, language of "at least one of X, Y, and Z" and "one or more of X, Y and Z" may be construed as X only, Y only, Z only, or any combination of two or more items X, Y, and Z (e.g., XYZ, XY, YZ, XZ, and the like). Similar logic may be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that there are yet more alternative examples and modifications possible, and that the above examples are only illustrations of one or more examples. The scope, therefore, is only to be limited by the claims appended hereto.

What is claimed is:

1. A device comprising:

a circuit board;

a plurality of light emitting diode (LED) packages arranged on the circuit board, an LED package comprising:

a pair of red LEDs arranged adjacent to one another, the pair of red LEDs configured to emit respective red light at respective different red wavelengths;

a pair of green LEDs arranged adjacent to one another, the pair of green LEDs configured to emit respective green light at respective different green wavelengths;

a pair of blue LEDs arranged adjacent to one another, the pair of blue LEDs configured to emit respective blue light at respective different blue wavelengths; and an integrated circuit (IC) configured to independently control the pair of red LEDs, the pair of green LEDs and the pair of blue LEDs; and an electrical connector connected to respective integrated circuits of the plurality of LED packages, the electrical connector configured to communicate with an image providing device.

2. The device of claim 1, wherein the circuit board further comprises perforations therethrough that permit sound to travel through the circuit board.

3. The device of claim 1, wherein the circuit board further comprises perforations therethrough that permit sound to travel through the circuit board, the perforations between adjacent LED packages other than in a region of the electrical connector.

4. The device of claim 1, wherein the respective different red wavelengths, the respective different green wavelengths and the respective different blue wavelengths are selected to meet the ITU-R (International Telecommunication Union-Radiocommunication Sector) Recommendation BT (Broadcast Television).2020 color space.

5. The device of claim 1, wherein the respective different red wavelengths, the respective different green wavelengths and the respective different blue wavelengths are each selected to be at least 20 nm apart.

6. The device of claim 1, wherein ICs of the plurality of LED packages are addressable such that the plurality of LED packages are arranged in an active matrix.

7. A light emitting diode (LED) package comprising:

a pair of red LEDs arranged adjacent to one another, the pair of red LEDs configured to emit respective red light at respective different red wavelengths;

a pair of green LEDs arranged adjacent to one another, the pair of green LEDs configured to emit respective green light at respective different green wavelengths;

a pair of blue LEDs arranged adjacent to one another, the pair of blue LEDs configured to emit respective blue light at respective different blue wavelengths; and an integrated circuit (IC) configured to independently control the pair of red LEDs, the pair of green LEDs and the pair of blue LEDs.

8. The LED package of claim 7, wherein the respective different red wavelengths, the respective different green wavelengths and the respective different blue wavelengths are selected to meet the ITU-R (International Telecommunication Union-Radiocommunication Sector) Recommendation BT (Broadcast Television).2020 color space.

9. The LED package of claim 7, wherein the respective different red wavelengths, the respective different green wavelengths and the respective different blue wavelengths are each selected to be at least 20 nm apart.

10. The LED package of claim 7, wherein the IC is addressable.

* * * * *